(12) United States Patent
Jun et al.

(10) Patent No.: US 12,100,607 B2
(45) Date of Patent: Sep. 24, 2024

(54) MAGNETIC COLLET

(71) Applicant: OKINS ELECTRONICS CO., LTD, Uiwang-si (KR)

(72) Inventors: Jin Kook Jun, Gunpo-si (KR); Sung Gye Park, Anyang-si (KR); Soung Hun Choi, Seoul (KR)

(73) Assignee: OKINS ELECTRONICS CO., LTD, Uiwang-si (KR)

(*) Notice: Subject to any disclaimer, the term of this patent is extended or adjusted under 35 U.S.C. 154(b) by 0 days.

(21) Appl. No.: 18/452,271

(22) Filed: Aug. 18, 2023

(65) Prior Publication Data

US 2023/0395413 A1 Dec. 7, 2023

Related U.S. Application Data

(62) Division of application No. 17/154,253, filed on Jan. 21, 2021, now abandoned.

(30) Foreign Application Priority Data

Jan. 23, 2020 (KR) .................. 10-2020-0009077
Jan. 23, 2020 (KR) .................. 10-2020-0009078
Jan. 23, 2020 (KR) .................. 10-2020-0009079

(51) Int. Cl.
*H01L 21/677* (2006.01)
*H01F 7/02* (2006.01)

(52) U.S. Cl.
CPC ..... *H01L 21/67721* (2013.01); *H01F 7/0252* (2013.01)

(58) Field of Classification Search
CPC ........... H01L 21/67721; H01L 21/6838; H01L 21/68707; H01L 21/67121; H01F 7/0252; H01F 7/0257

See application file for complete search history.

(56) References Cited

FOREIGN PATENT DOCUMENTS

| CN | 104465482 A | | 3/2015 |
|---|---|---|---|
| KR | 200414775 | | 4/2006 |
| KR | 20080058885 | | 6/2008 |
| KR | 100843222 B1 | * | 7/2008 |
| KR | 20100006154 A | * | 1/2010 |
| KR | 101385443 | | 4/2014 |
| KR | 101577958 B1 | * | 12/2015 |
| KR | 101731932 B1 | * | 5/2017 |
| KR | 101776632 B1 | * | 9/2017 |

(Continued)

OTHER PUBLICATIONS

Machine translation for KR102057784B1.*

(Continued)

*Primary Examiner* — Mohamad A Musleh
(74) *Attorney, Agent, or Firm* — CANTOR COLBURN LLP

(57) ABSTRACT

Provided is a magnetic collet. The magnetic collet includes adsorption rubber including a plurality of individual holes passing therethrough from a contact surface, which is one surface of the adsorption rubber, coming into contact with a semiconductor chip to the other surface thereof, and a metal plate including a common hole which passes therethrough from one surface of the metal plate to the other surface thereof and provides a common passage connected to the individual holes and stacked on the adsorption rubber.

3 Claims, 20 Drawing Sheets

(56) References Cited

FOREIGN PATENT DOCUMENTS

| | | |
|---|---|---|
| KR | 20180102975 | 9/2018 |
| KR | 102057784 | 12/2019 |
| KR | 20200005235 | 1/2020 |
| TW | 201741119 A | 12/2017 |

OTHER PUBLICATIONS

Korean Office Action—Korean Application No. 10-2020-0009077 issued on Jul. 9, 2021, citing KR 10-2018-0102975 and KR 10-2020-0005235.
Korean Office Action—Korean Application No. 10-2020-0009078 issued on Jul. 12, 2021, citing KR 10-1385443 and KR 10-2018-0102975.
Korean Office Action—Korean Application No. 10-2020-0009079 issued on May 17, 2021, citing KR 10-2057784 and KR 10-2008-0058885.

\* cited by examiner

FIG. 1  *Prior Art*

MAGNETIC COLLET

BACKGROUND

1. Field of the Invention

The present invention relates to a magnetic collet, and more specifically, to a magnetic collet applicable to a collet holder having a flat contact surface.

2. Discussion of Related Art

Generally, in a semiconductor package assembly process, a process of separating semiconductor chips (also referred to as "dies") of a wafer and attaching lead frames to the semiconductor chip or attaching the semiconductor chip to a substrate such as a printed circuit board (PCB) using an epoxy adhesive and the like is referred to as a chip attachment process. Since the chip attachment process is a first step of individually separating and commercializing the plurality of chips formed on the wafer, a process of cutting the wafer in units of single chips and separating the chips from each other should be performed in advance.

As described above, the assembly process of the semiconductor chip package requires a process of cutting the wafer on which the plurality of chips are formed in units of single chips and a process of picking up the individually cut chip and transferring the chip to a mounting portion of a package body for the chip attachment process of attaching the individually cut chip to the package body. Here, in a semiconductor chip transfer apparatus which picks up and transfers the semiconductor chips made by cutting the wafer, a portion which directly comes into contact with the chip is referred to as a collet.

In addition to the above-described semiconductor package assembly process, the semiconductor chip transfer apparatus including the collet may also be used in a vision inspection process of inspecting whether the appearance status of the semiconductor chip is good, such as whether there is surface damage, scratches, or defects of the semiconductor chip.

Generally, the semiconductor chip transfer apparatus includes a vacuum supply tube provided with a hole through which air is suctioned so as to provide a vacuum suction force to the semiconductor chip, a collet holder which is connected to the vacuum supply tube so that the hole is exposed through a lower surface thereof, and a collet including a flexible adsorption rubber having a hole communicating with the hole of the vacuum supply tube and insertion-coupled to the lower surface of the collet holder.

Particularly, in Republic of Korean Utility Model Gazette No. 20-0414775, etc., a semiconductor chip transfer apparatus is proposed which allows a collet holder to have a magnetic force so that a collet in which adsorption rubber is coupled to a metal plate may be coupled to the collet holder. Generally, the collet used in the semiconductor chip transfer apparatus is referred to as a "magnetic collet."

FIG. 1 is a view illustrating a conventional magnetic collet 10 and a conventional collet holder 20.

Referring to FIG. 1, in the conventional collet holder 20, a holder hole 22 connected to a vacuum supply tube through which air is suctioned is exposed through a lower surface 21 thereof, that is, a contact surface 21, in contact with the collet 10. In this case, the magnetic collet 10, in which adsorption rubber 11 is coupled to a metal plate 12, is coupled to the contact surface 21 of the collet holder 20. Particularly, the collet holder 20 also includes a common groove 23 in the contact surface 21 in addition to the holder hole 22. That is, the common groove 23 is a groove which is formed in the contact surface 21 of the collet holder 20 and connected to (communicates with) a plurality of holes of the magnetic collet 10 to provide a common passage for the holes.

Accordingly, only when the collet holder 20 includes the common groove 23 in the contact surface 21, a vacuum suction force may be properly applied through the plurality of holes of the conventional magnetic collet 10 to adsorb a semiconductor chip, and thus a semiconductor chip transfer function may be performed. That is, there is a problem in that the conventional magnetic collet 10 may not be applied to the collet holder 20 in which the contact surface 21 is flat because the common groove 23 is not provided in the contact surface 21.

Meanwhile, in the conventional magnetic collet, the contact surface of the adsorption rubber which comes into contact with the semiconductor chip has a flat structure in order to transfer the semiconductor chip. Accordingly, in the case of the conventional magnetic collet, the conventional magnetic collet should approach the semiconductor chip so that separation distances from all areas of the contact surface of the adsorption rubber to the semiconductor chip are maintained identically while the separation distances are gradually decreased.

In a case in which the above-described maintaining condition is not satisfied, and any one region of the contact surface of the adsorption rubber approaches the semiconductor chip first, a problem occurs in that the corresponding semiconductor chip is adsorbed onto the adsorption rubber in a state in which a position of the corresponding semiconductor is changed or the semiconductor is affected to change a position thereof. In addition, since such a maintaining condition requires a more precise position adjustment technology for the magnetic collet, there is a problem in that a manufacturing cost of a corresponding transfer apparatus is increased.

In addition, in the conventional magnetic collet, since a contact surface between the adsorption rubber and the metal plate, which are in contact with each other, does not include an additional structure for coupling, the adsorption rubber and the metal plate have structures to be coupled using an adhesive and the like. As a result, in a case in which the magnetic collet needs to be replaced to correspond to sizes of various chips, a problem occurs in that an entirety of the magnetic collet to which the adsorption rubber and the metal plate are attached should be replaced.

RELATED ART

Patent Document (Patent Document 1) KR20-0414775 Y

SUMMARY OF THE INVENTION

The present invention is directed to providing a magnetic collet allowing a transfer function for a semiconductor chip to be performed even in a case in which a contact surface of a collet holder is flat because the collet holder does not include a common groove in the contact surface.

In addition, the present invention also is directed to providing a magnetic collet formed in a shape allowing an effect of a contact surface which comes into contact with a semiconductor chip on a position change of a semiconductor chip to be reduced.

In addition, the present invention also is directed to providing a magnetic collet having a structure in which adsorption rubber and a metal plate are replaceable.

However, objectives to be solved by the present invention are not limited to the above-described objectives, and objectives which are not described above will be clearly understood by those skilled in the art through the following description.

According to an aspect of the present invention, there is provided a magnetic collet including adsorption rubber including a plurality of individual holes passing therethrough from a contact surface, which is one surface of the adsorption rubber, coming into contact with a semiconductor chip to the other surface thereof, and a metal plate including a common hole which passes therethrough from one surface of the metal plate to the other surface thereof and provides a common passage connected to the individual holes and stacked on the adsorption rubber.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
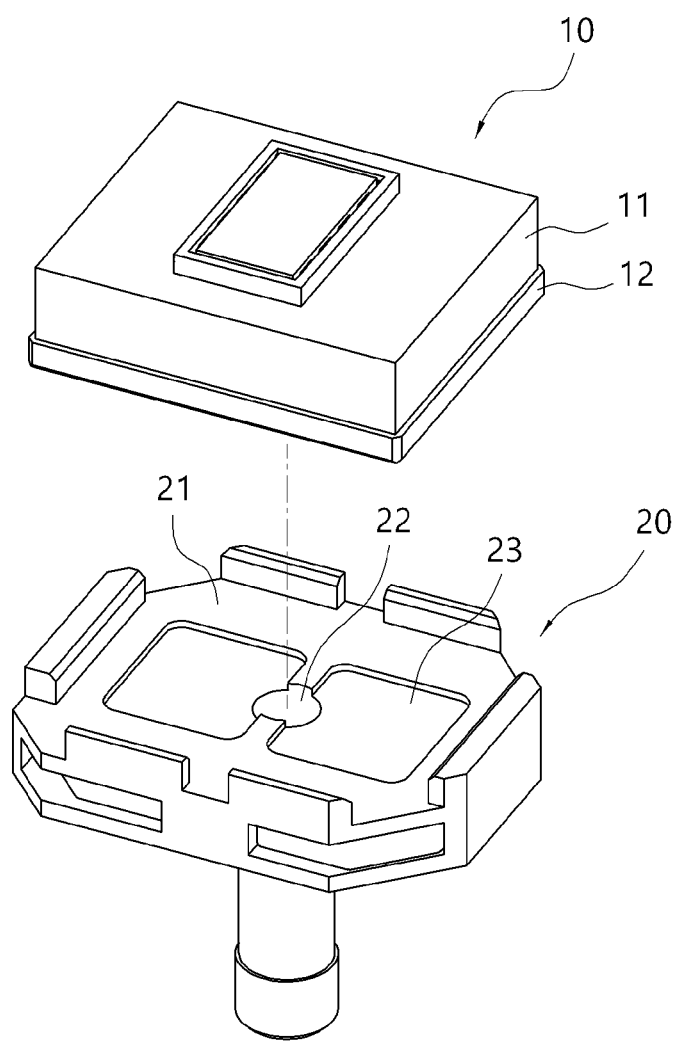
FIG. 1 is a view illustrating a conventional magnetic collet (10) and a conventional collet holder (20)

Purposes and methods of the present invention and effects according thereto will be further clarified through the following detailed descriptions with respect to the accompanying drawings, and thus the technical spirit of the present invention may be easily implemented by those skilled in the art. In addition, when it is determined that the detailed descriptions of related well-known technologies unnecessarily obscure the gist of the invention, the detailed descriptions will be omitted.

The terms used herein are provided only to describe embodiments of the present invention and not for purposes of limitation. Unless the context clearly indicates otherwise, the singular forms include the plural forms. The terms such as "comprise," "include," "provide," and "have," when used in the specification, specify some stated components but do not preclude the presence or addition of one or more other components.

In the present specification, the terms such as "or," "at least one," and the like may indicate one of words mentioned together or a combination including two or more thereof. For example, "A or B" and "at least one of A and B" may include only one of A or B or both of A and B.

In the specification, a description followed by "for example" and the like may not exactly match with provided information such as features, variables, or values and should not restrict the various embodiments of the present invention due to a tolerance, a measurement error, a limit of measurement accuracy, and an effect such as a change in addition to generally known other factors.

In the present specification, when an element is referred to as being "connected" or "coupled" to another element, it will be understood that the element can be directly connected or coupled to another element or intervening elements may be present therebetween. In contrast, when an element is referred to as being "directly connected" or "directly coupled" to another element, it will be understood there are no intervening elements.

In the present specification, when an element is referred to as being "on" or "in contact with" another element, it will be understood that the element can be directly in contact with or connected to another element or intervening elements may be present therebetween. In contrast, when an element is referred to as being "directly on" or "in direct contact with" another element, it will be understood there are no intervening elements. Other expressions describing the relationship between elements, for example, "between" and "directly between" can be similarly interpreted as well.

In the present specification, the terms such as "first," "second," and the like may be used to describe various elements, but the elements should not be limited thereto. In addition, the terms should not be interpreted to limit an order of the elements and may be used for a purpose of distinguishing one element from another element. For example, "a first element" may be referred to as "a second element," and similarly, "a second element" may also be referred to as "a first element."

Unless otherwise defined, all terms used herein can be used as is customary in the art to which this invention belongs. Also, it will be understood that terms, such as those defined in commonly used dictionaries, will not be interpreted in an idealized or overly formal sense unless expressly so defined herein.

Hereinafter, exemplary embodiments according to the present invention will be described in detail with reference to the accompanying drawings.

First Embodiment

Figure 2:
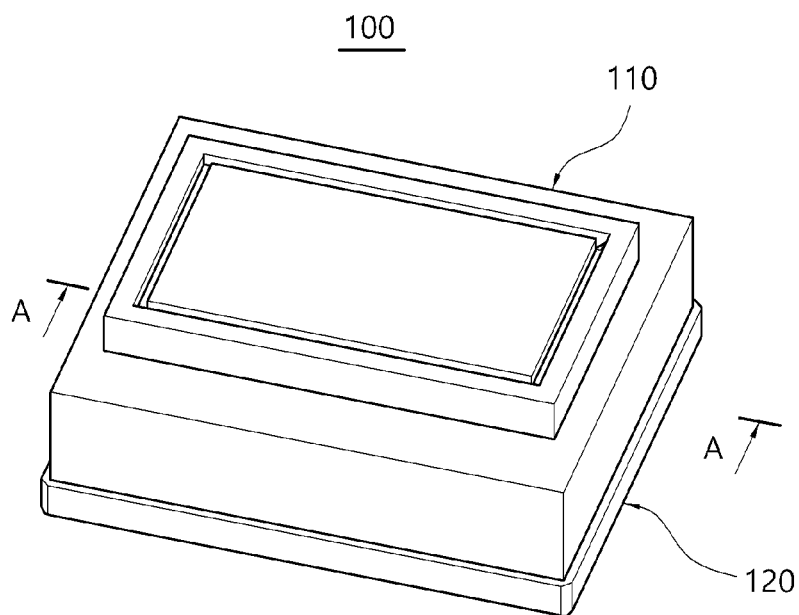
FIG. 2 is a perspective view illustrating a magnetic collet (100) according to a first embodiment of the present invention.
Figure 9:
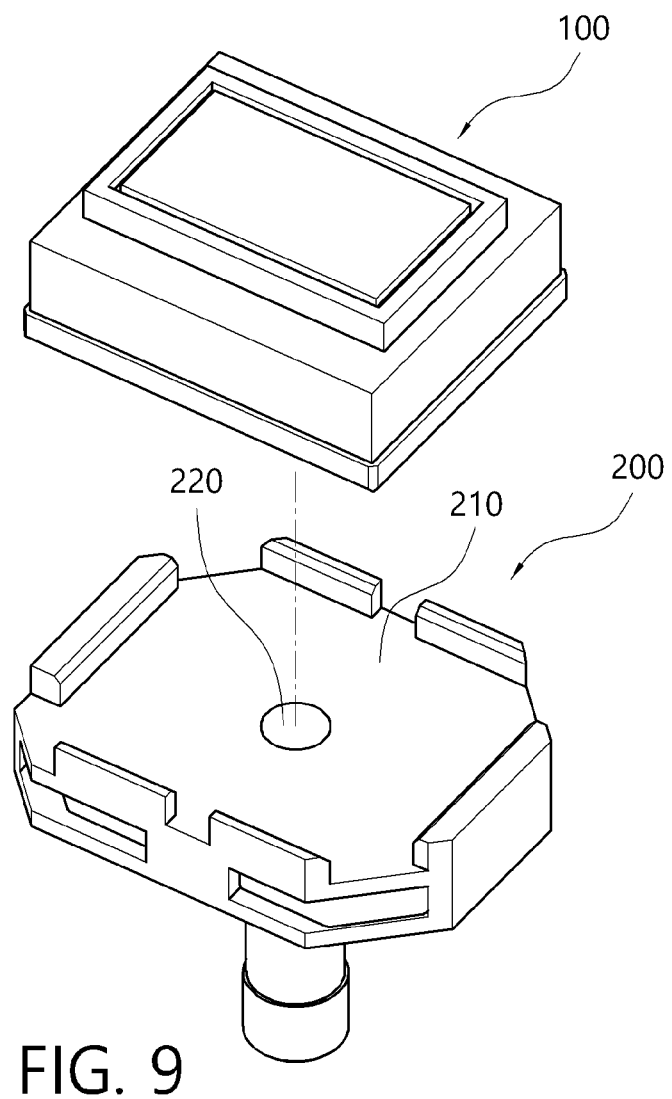
FIG. 9 is a view illustrating a semiconductor chip transfer apparatus according to the first embodiment of the present invention.

FIG. 2 is a perspective view illustrating a magnetic collet 100 according to a first embodiment of the present invention, and FIG. 9 is a view illustrating a semiconductor chip transfer apparatus according to the first embodiment of the present invention.

The semiconductor chip transfer apparatus according to the first embodiment of the present invention is an apparatus configured to pick up and transfer semiconductor chips, which are made by cutting a wafer, and includes a magnetic collet 100 and a collet holder 200 as illustrated in FIGS. 2 and 9. In addition to a semiconductor package assembly process, the semiconductor chip transfer apparatus according to the first embodiment of the present invention may be used in a vision inspection process of inspecting whether the appearance of the semiconductor chip is good, such as whether there is surface damage, scratches, or defects of the semiconductor chip.

The collet holder 200 is a holder referred to as a shank coupled to the magnetic collet 100, and a holder hole 220 is formed in a lower surface (that is, a contact surface) 210 thereof in contact with the magnetic collet 100. In this case, a passage of the holder hole 220 is connected to a vacuum supply tube through which air is suctioned so as to provide a vacuum suction force to the semiconductor chip, and the holder hole 220 is exposed at the contact surface 210 of the collet holder 200.

The collet holder 200 includes a part (hereinafter, referred to as a "magnetic part") having a magnetic force. The magnetic part may be formed of one of various kinds of magnets having various sizes. Accordingly, the magnetic collet 100 including a metal plate 120 may be attached and coupled to the collet holder 200 by an attractive magnetic force generated between the metal plate 120 and the magnetic part of the collet holder 200.

The collet holder 200 may further include a fixing part for more firmly fixing the magnetic collet 100 attached and coupled to the collet holder 200. For example, the fixing part may include elastic members providing elastic forces applied in at least two directions toward a central portion thereof and moving members which are connected to the elastic members and are movable while elastically operating toward the central portion of the contact surface 210 but is not limited thereto. That is, adsorption rubber 110, particularly, a rubber base 112, of the magnetic collet 100, which will be described below, may also be further fixed between the moving members by the elastic forces.

Figure 3:
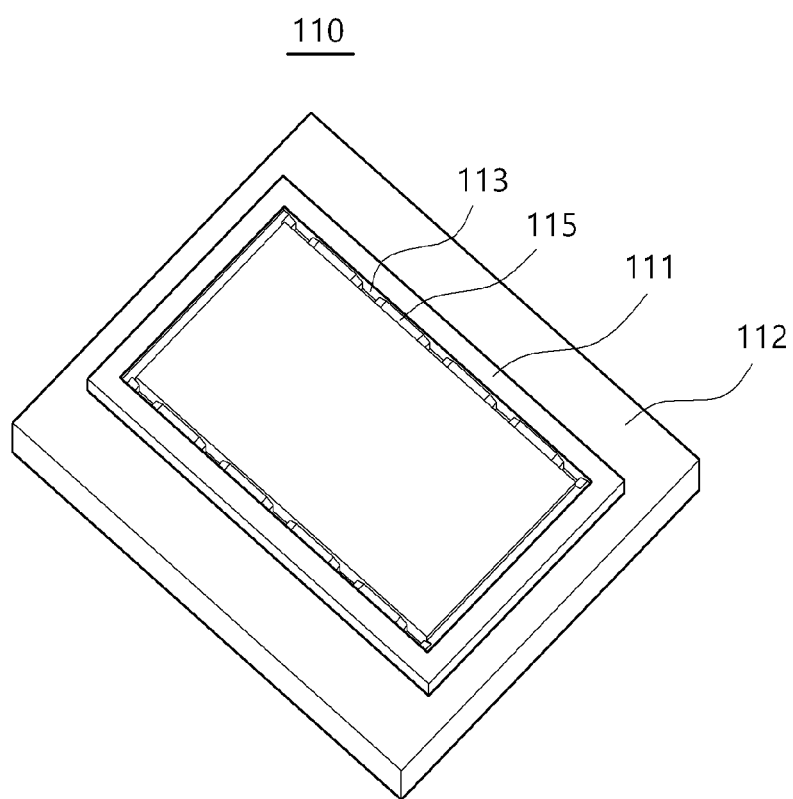
FIG. 3 is a perspective view illustrating adsorption rubber (110) of the magnetic collet (100) according to the first embodiment of the present invention when viewed from above.
Figure 4:
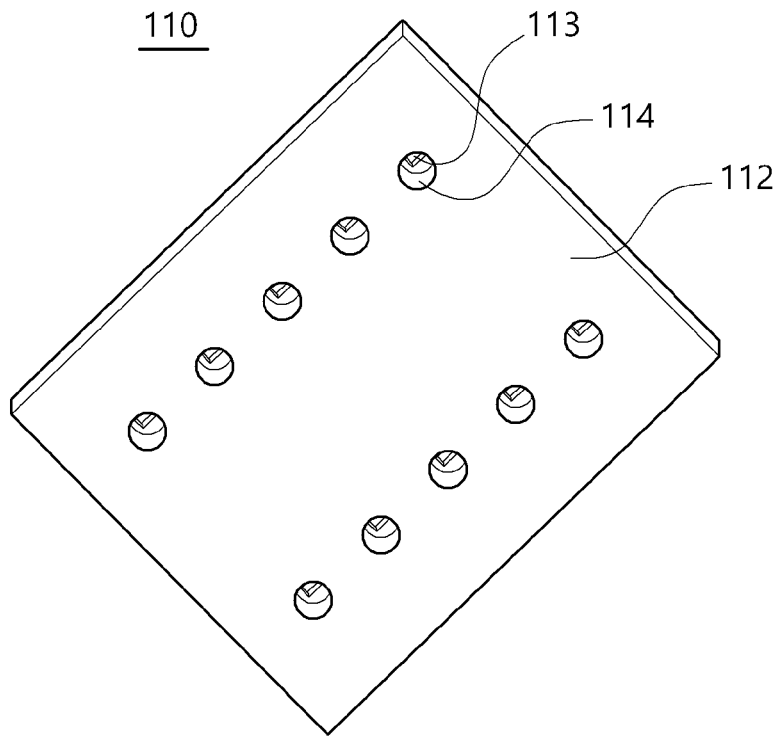
FIG. 4 is a perspective view illustrating the adsorption rubber (110) of the magnetic collet (100) according to the first embodiment of the present invention when viewed from below.
Figure 5:
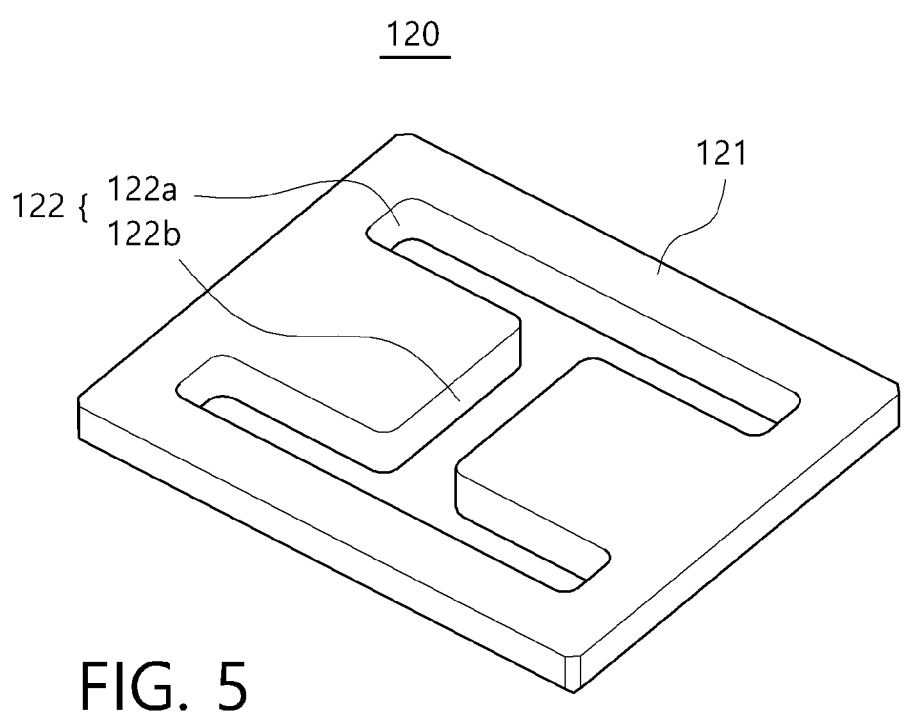
FIG. 5 is a perspective view illustrating a metal plate (120) of the magnetic collet (100) according to the first embodiment of the present invention when viewed from above.
Figure 6:
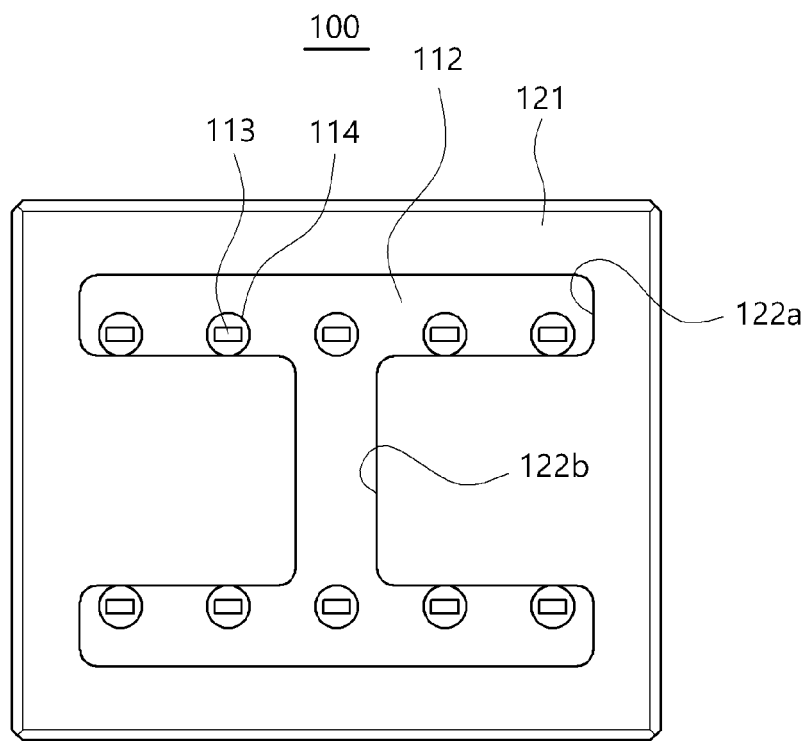
FIG. 6 is a bottom view illustrating the magnetic collet (100) according to the first embodiment of the present invention.
Figure 7:
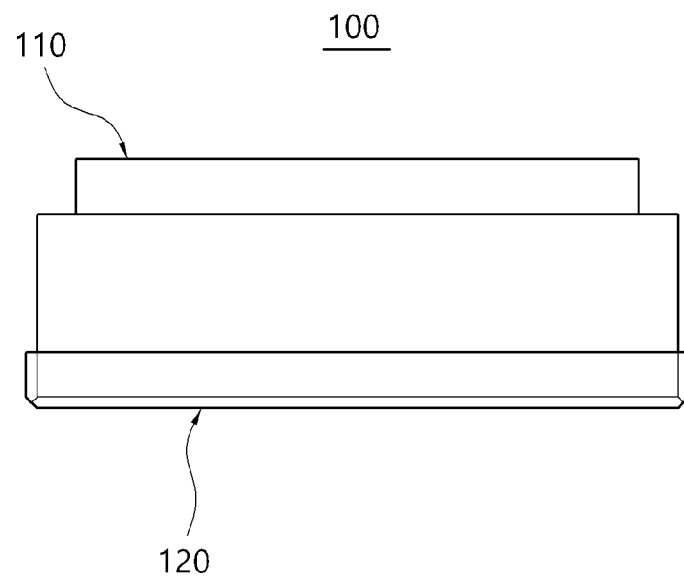
FIG. 7 is a side view illustrating the magnetic collet (100) according to the first embodiment of the present invention in a long axis direction thereof.
Figure 8:
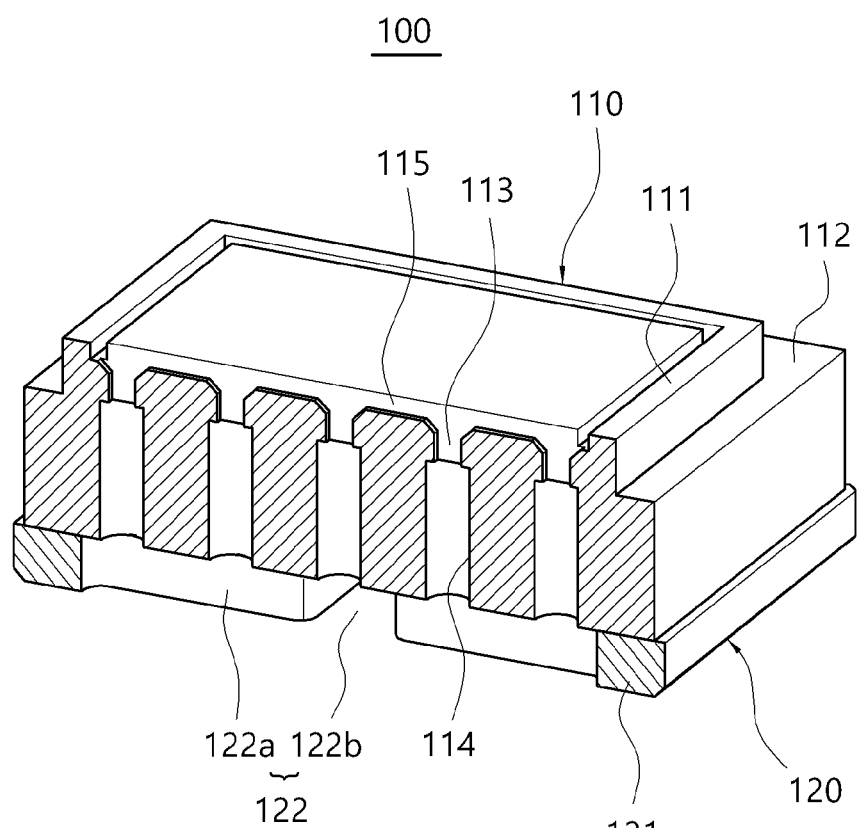
FIG. 8 is a cross-sectional view taken along line A-A of FIG. 2.

FIGS. 3 and 4 are perspective views illustrating the adsorption rubber 110 of the magnetic collet 100 according to the first embodiment of the present invention when viewed from above and below, respectively, FIG. 5 is a perspective view illustrating the metal plate 120 of the magnetic collet 100 according to the first embodiment of the present invention when viewed from above, FIG. 6 is a bottom view illustrating the magnetic collet 100 according to the first embodiment of the present invention, FIG. 7 is a side view illustrating the magnetic collet 100 according to the first embodiment of the present invention in a long axis direction thereof, and FIG. 8 is a cross-sectional view taken along line A-A of FIG. 2.

The magnetic collet 100 is a collet configured to pick up the semiconductor chip and includes the adsorption rubber 110 and the metal plate 120 as illustrated in FIGS. 2 to 9. That is, the magnetic collet 100 may pick up the semiconductor chip using a vacuum suction force supplied through the holder hole 220.

The adsorption rubber 110 is rubber including a rubber resin material and directly comes into contact with the semiconductor chip. The adsorption rubber 110 may include the rubber base 112 having a plate shape, a protrusion 111 protruding toward one surface of the rubber base 112, and a plurality of individual holes 113 and 114. In this case, one surface of the protrusion 111 may serve as a contact surface for the semiconductor chip, and the other surface of the rubber base 112 may serve as a contact surface for the metal plate 120. For example, the protrusion 111 and the rubber base 112 may be manufactured through a molding process and the like, formed of the same material, and integrally formed but are not limited thereto.

The individual holes 113 and 114 may be formed to pass therethrough from one surface of the protrusion 111 to the other surface of the rubber base 112. That is, the individual holes 113 and 114 may include first openings 113 formed in one surface of the protrusion 111 and second openings 114 formed in the other surface of the rubber base 112, and passages of the first openings 113 may be connected to passages of the second openings 114.

Particularly, in the individual holes 113 and 114, an area of the first opening 113 formed in one surface of the protrusion 111 may be less than an area of the second opening 114 formed in the other surface of the rubber base 112 in order to further increase the vacuum suction force applied from one surface of the protrusion 111. For example, the first opening 113 may have a polygonal shape of which a size is less than a size of the second opening 114, and the second opening 114 may have a circular shape of which the size is greater than the size of the first opening 113, but the first opening 113 and the second opening 114 are not limited thereto.

The metal plate 120 is a plate including a metal material. That is, one surface of the metal plate 120 is in contact with and coupled to the other surface of the rubber base 112 of the adsorption rubber 110, and the other surface of the metal plate 120 may be attached and coupled to the collet holder 200 by a magnetic force of the magnetic part of the collet holder 200 due to properties of the material thereof.

The metal plate 120 includes a common hole 122 formed in a metal base 121 having a plate shape. In this case, the common hole 122 is a hole passing therethrough from one surface of the metal base 121 to the other surface thereof and is connected to (communicates with) the individual holes 113 and 114 of the adsorption rubber 110 to provide a common passage therefor. Accordingly, the vacuum suction force applied through the holder hole 220 of the collet holder 200 may be distributed and applied to the individual holes 113 and 114 through the common hole 122. As a result, in the present invention, there is an advantage in that a transfer function for the semiconductor chip may be performed even in a case in which the contact surface 210 is flat because the collet holder 200 does not include an additional common groove in the contact surface 210.

In addition, the adsorption rubber 110 may also further include a common groove 115. In this case, the common groove 115 is a groove concavely formed in one surface of the protrusion 111 in a direction toward the other surface thereof and is connected to (communicates with) the individual holes 113 and 114 to provide a common passage therefor. The common groove 115 may restrict a range of the vacuum suction force applied through the individual holes 113 and 114 and further increase a magnitude of the vacuum suction force. However, a diameter of the passage of the common groove 115 may be less than a diameter of the passage of the common hole 122, which will be described below, to further increase the vacuum suction force applied from one surface of the protrusion 111. In this case, an area of a range in which the individual holes 113 and 114 and the common groove 115 are formed may be less than an area of the semiconductor chip for suction and attachment of the semiconductor chip. For example, the common groove 115 may be formed in a shape such as a polygonal ring shape including a quadrilateral shape but is not limited thereto.

Particularly, for more effective attachment for the semiconductor chip, the individual holes 113 and 114 of the adsorption rubber 110 may be disposed in at least two rows in a direction from a first side of one surface of the protrusion 111 to a second side which is a corresponding side thereof. That is, referring to FIG. 6, a left vertical line portion may be disposed in a direction toward the first side, and a right vertical line portion may be disposed in the direction toward the second side. In this case, in the individual holes 113 and 114, the opening 113 of the protrusion 111 may be formed in a shape extending in the direction from the first side toward the second side. This is to match directions of common suction forces applied through the individual holes 113 and 114 according to the arrangement directions thereof.

In addition, the common hole 122 of the metal plate 120 may be formed in an "H" shape in which two first holes 122*a* spaced apart from each other and a second hole 122*b* connecting the first holes 122*a* are formed. In this case, the individual holes 113 and 114 of the adsorption rubber 110 may be disposed in the rows at positions corresponding to the first holes 122*a* of metal plate 120. However, unlike FIG. 6, one or more of the individual holes 113 and 114 of the adsorption rubber 110 may be disposed at positions corresponding to the second hole 122*b* of the metal plate 120. Particularly, the arrangement of the common hole 122 having the "H" shape and the arrangement of the individual holes 113 and 114 according thereto may allow a common connecting passage therebetween to be restricted within a specific range to further increase the vacuum suction force.

Second Embodiment

Figure 10:
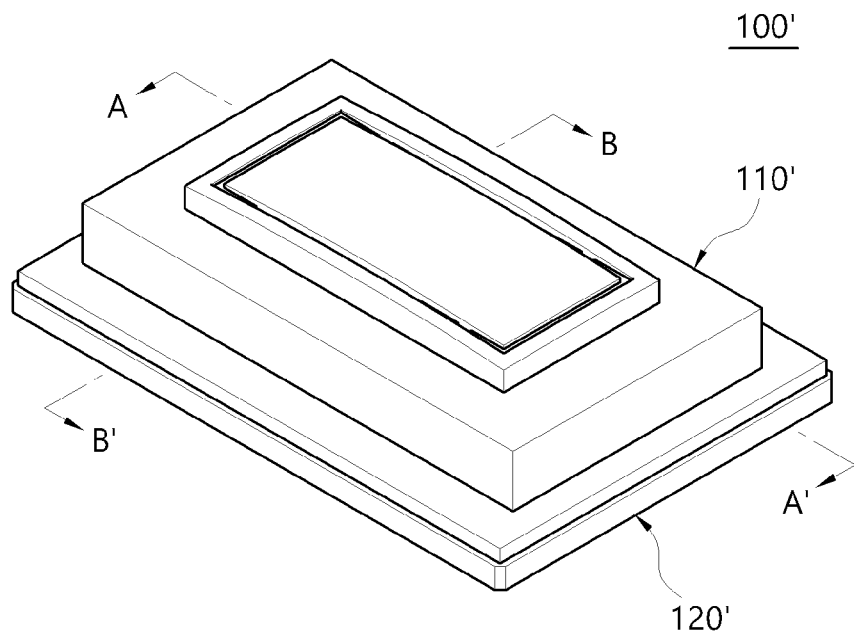
FIG. 10 is a perspective view illustrating a magnetic collet (100') according to a second embodiment of the present invention.
Figure 19:
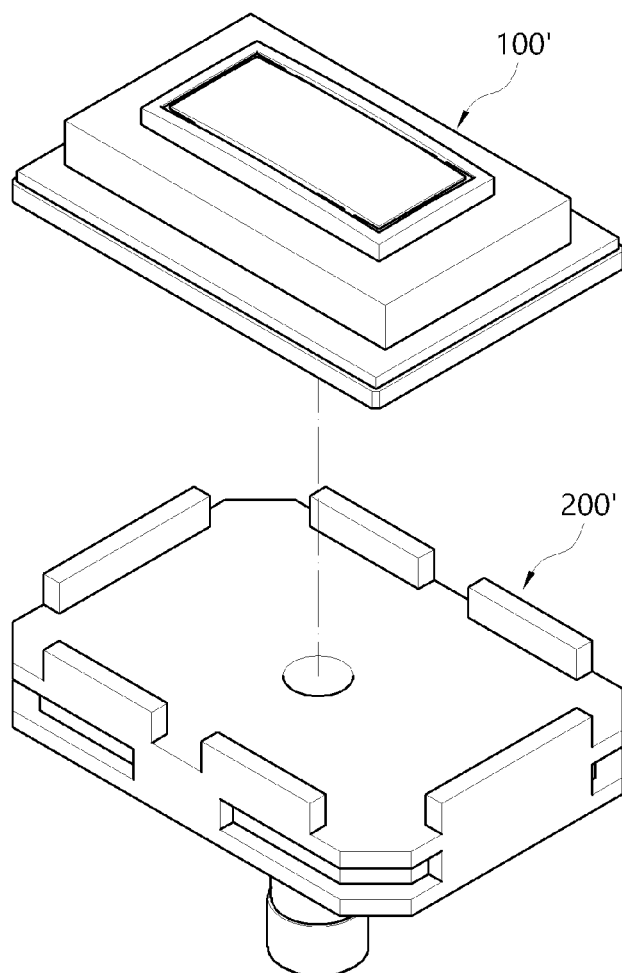
FIG. 19 is a view illustrating a semiconductor chip transfer apparatus according to the second embodiment of the present invention semiconductor chip.
Figure 20A:
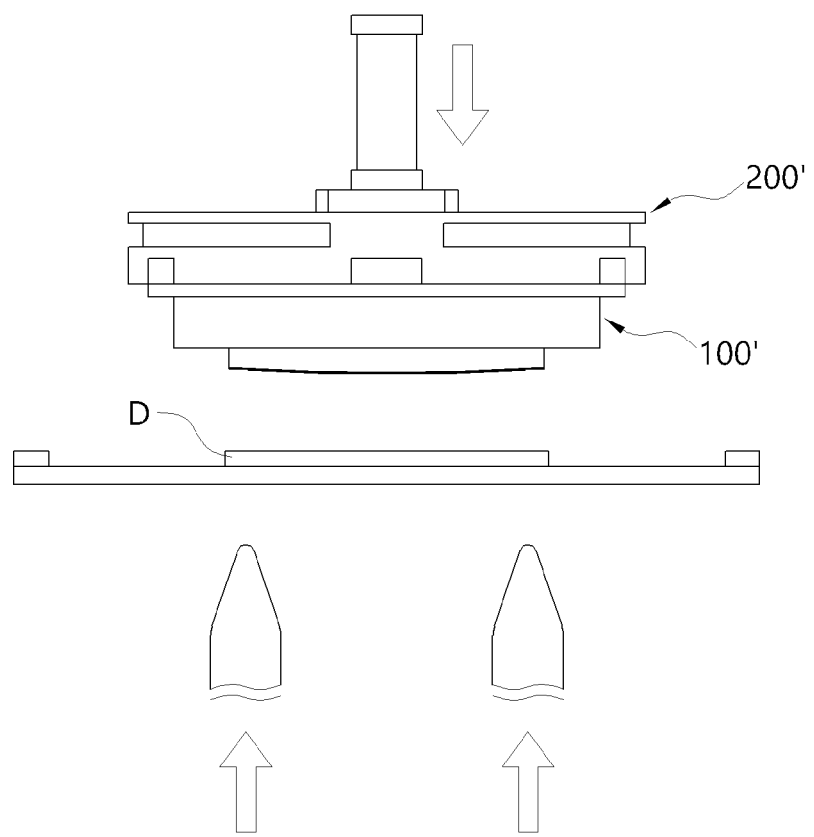
FIGS. 20A to 20F are views illustrating a process of transferring a semiconductor chip (D) performed by the semiconductor chip transfer apparatus according to the second embodiment of the present invention.
Figure 20B:
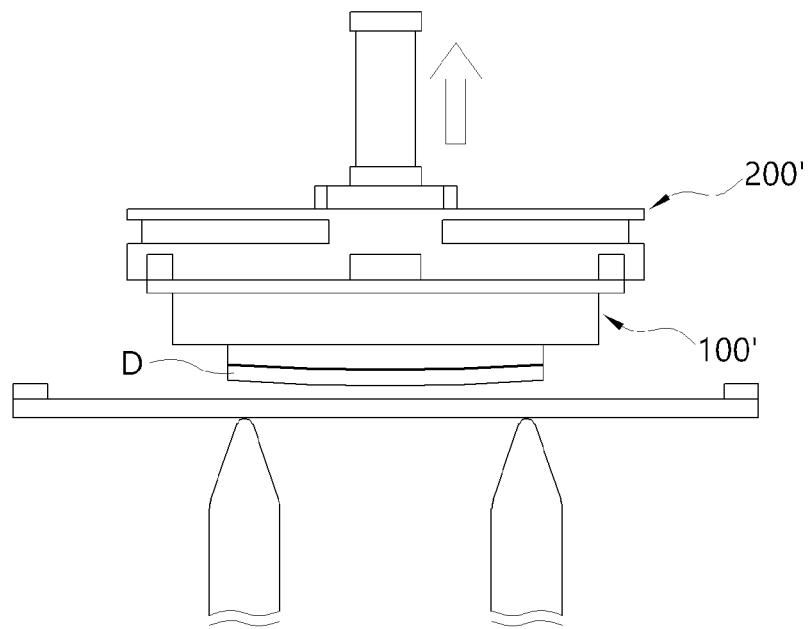
Figure 20C:
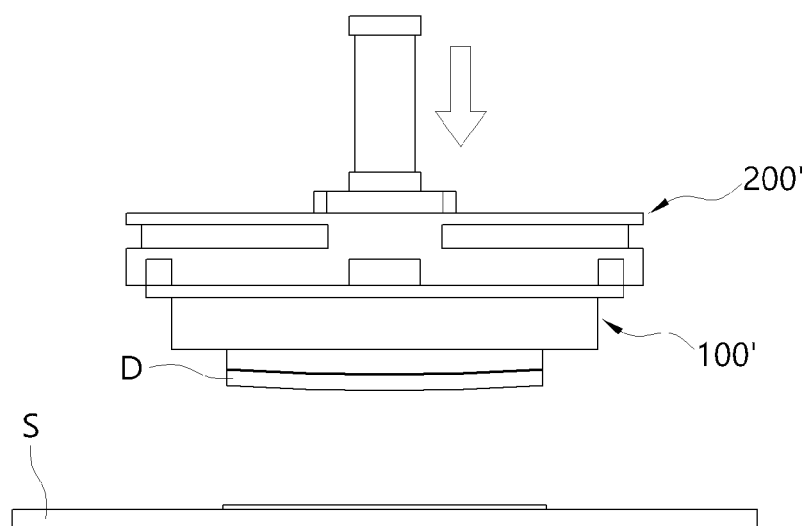
Figure 20D:
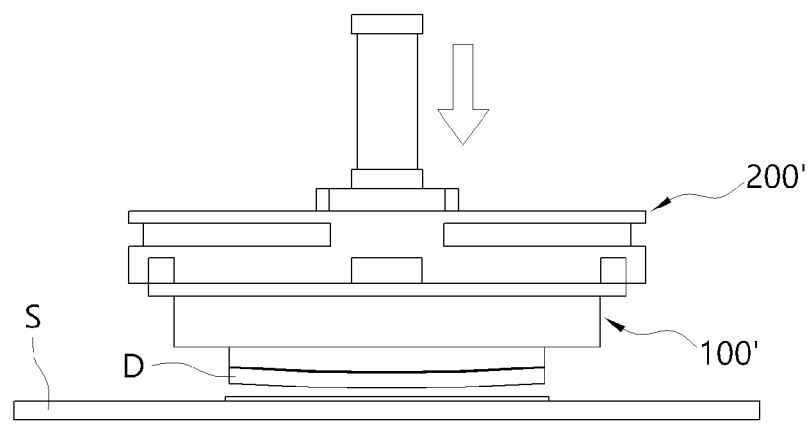
Figure 20E:
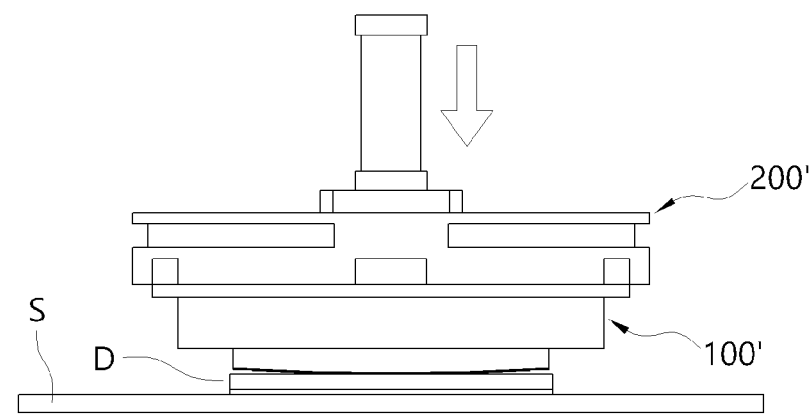
Figure 20F:
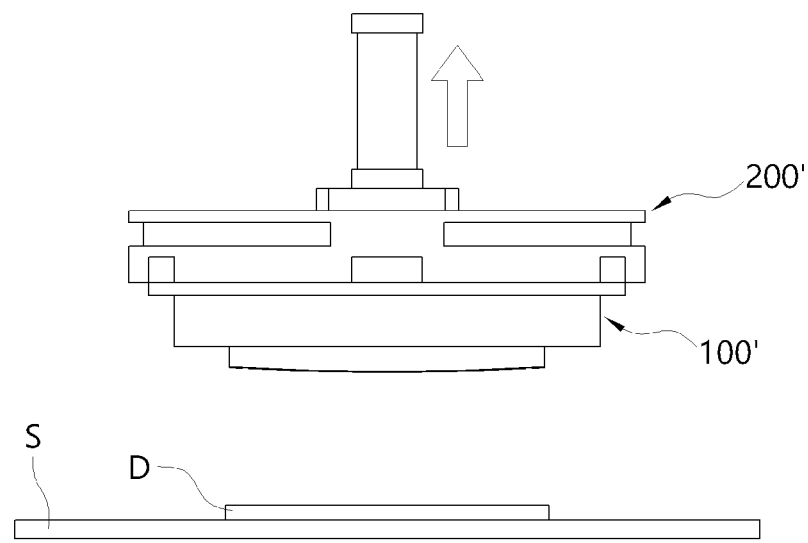

FIG. 10 is a perspective view illustrating a magnetic collet 100' according to a second embodiment of the present invention, and FIG. 19 is a view illustrating a transfer apparatus for a semiconductor chip D according to the second embodiment of the present invention semiconductor chip. In addition, FIGS. 20A to 20F are views illustrating a process of transferring the semiconductor chip D performed by the transfer apparatus for the semiconductor chip D according to the second embodiment of the present invention.

The semiconductor chip transfer apparatus according to the second embodiment of the present invention is an apparatus configured to pick up and transfer the semiconductor chip (also referred to as a "die") D and includes a magnetic collet 100' and a collet holder 200' as illustrated in FIGS. 10, 19, and 20. In addition to a semiconductor package assembly process, the semiconductor chip transfer apparatus according to the second embodiment of the present invention may be used in a vision inspection process of inspecting whether the appearance of the semiconductor chip D is good, such as whether there is surface damage, scratches, or defects of the semiconductor chip D.

The collet holder 200' is a holder referred to as a shank coupled to the magnetic collet 100', and a holder hole 220' is formed in a lower surface (that is, a contact surface) 210' thereof in contact with the magnetic collet 100'. In this case, a passage of the holder hole 220' is connected to a vacuum supply tube through which air is suctioned so to provide a vacuum suction force to the semiconductor chip D, and the holder hole 220' is exposed at the contact surface 210' of the collet holder 200'.

The collet holder 200' includes a part (hereinafter, referred to as a "magnetic part") having a magnetic force. The magnetic part may be formed of one of various kinds of magnets having various sizes. Accordingly, the magnetic collet 100' including a metal plate 120' may be attached and coupled to the collet holder 200' by an attractive magnetic force generated between the metal plate 120' and the magnetic part of the collet holder 200'.

The collet holder 200' may further include a fixing part for more firmly fixing the magnetic collet 100' attached and coupled to the collet holder 200'. For example, the fixing part may include elastic members providing elastic forces applied in at least two directions toward a central portion thereof and moving members which are connected to the elastic members and are movable while elastically operating toward the central portion of the contact surface 210' but is not limited thereto. That is, adsorption rubber 110', particularly, a rubber base 113', of the magnetic collet 100', which will be described below, may also be further fixed between the moving members by the elastic forces.

Figure 11:
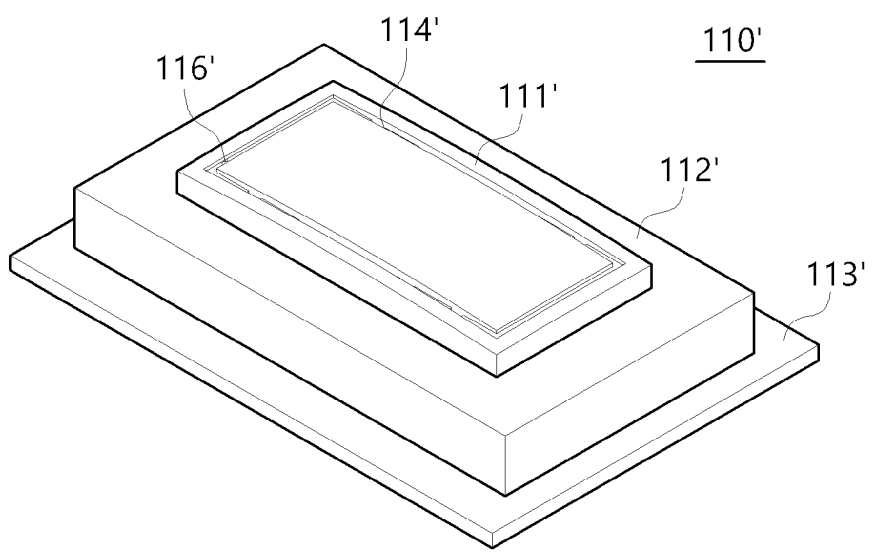
FIG. 11 is a perspective view illustrating adsorption rubber (110') of the magnetic collet (100') according to the second embodiment of the present invention when viewed from above.
Figure 12:
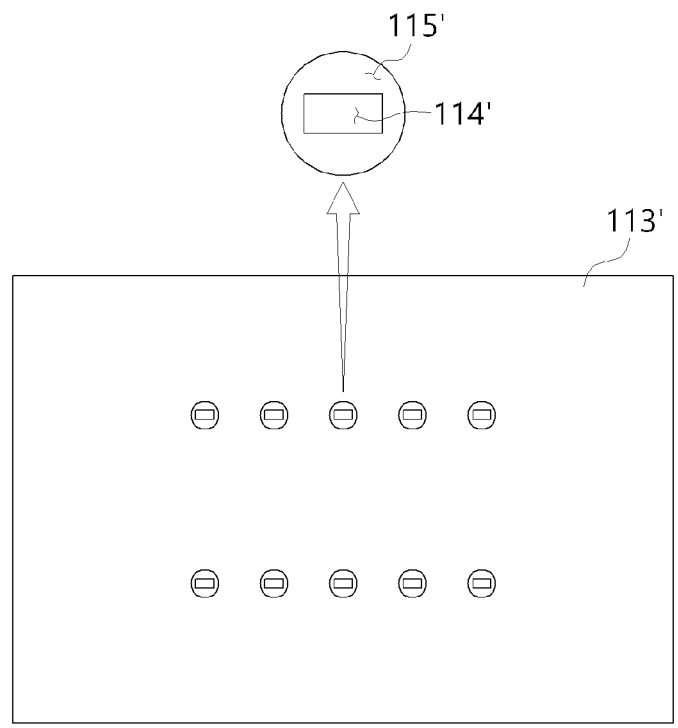
FIG. 12 is a bottom view illustrating the adsorption rubber (110') of the magnetic collet (100') according to the second embodiment of the present invention.
Figure 13:
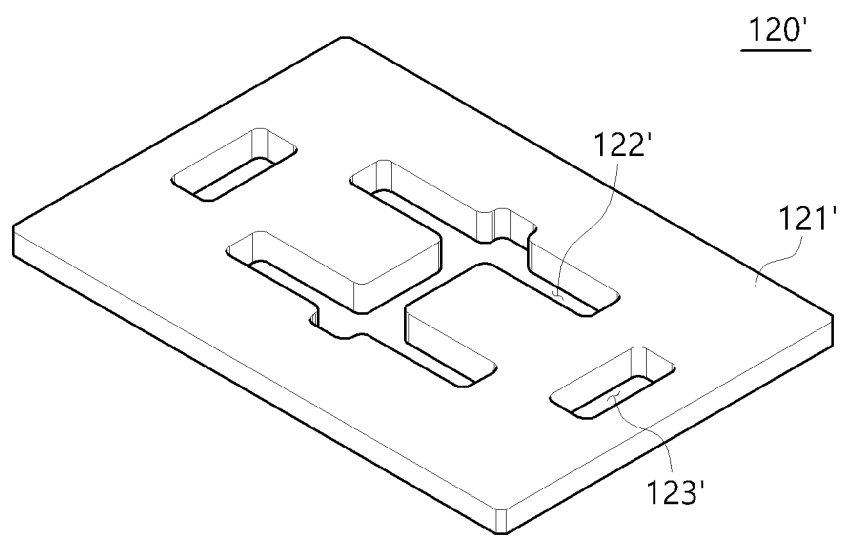
FIG. 13 is a perspective view illustrating a metal plate (120') of the magnetic collet (100') according to the second embodiment of the present invention when viewed from above.
Figure 14:
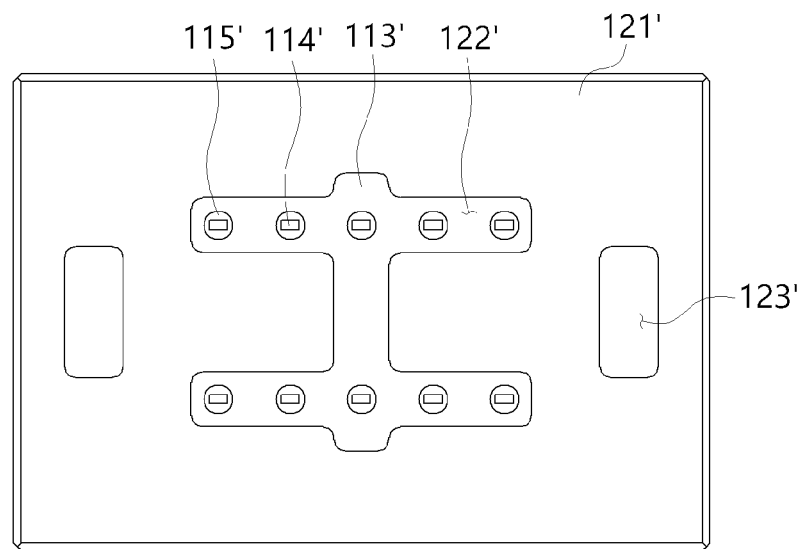
FIG. 14 is a bottom view illustrating the magnetic collet (100') according to the second embodiment of the present invention.
Figure 15:
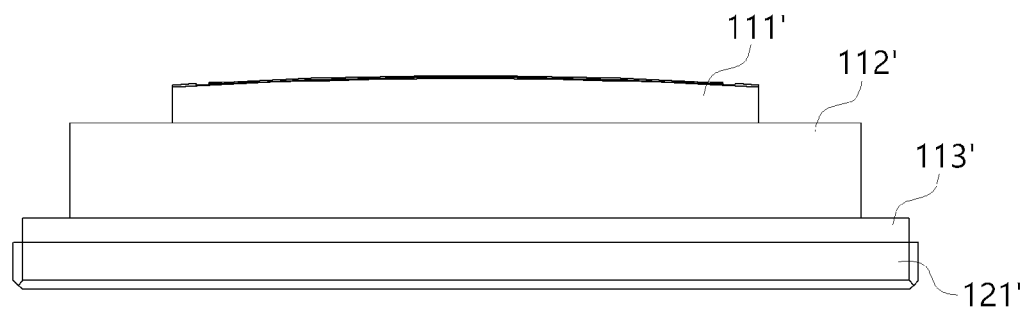
FIG. 15 is a side view illustrating the magnetic collet (100') according to the second embodiment of the present invention in a long axis direction thereof.
Figure 16:
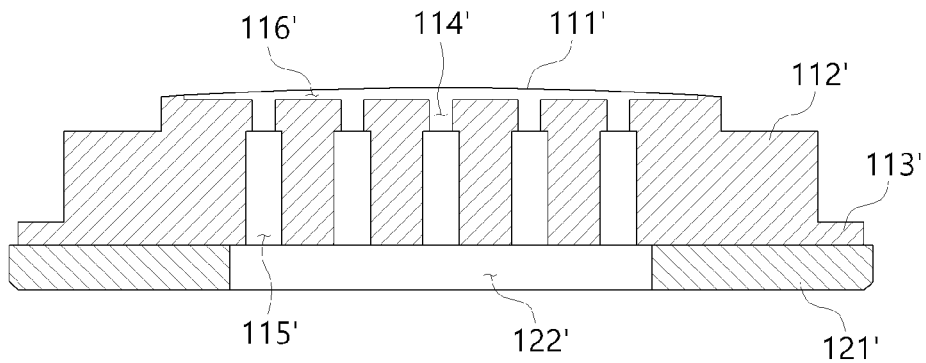
FIG. 16 is a cross-sectional view taken along line A-A of FIG. 10.
Figure 17:
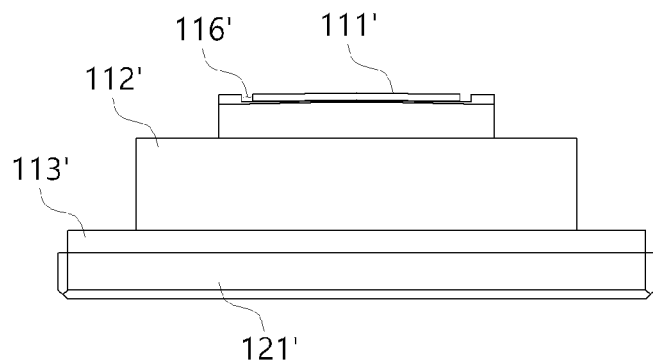
FIG. 17 is a side view illustrating the magnetic collet (100') according to the second embodiment of the present invention in a short axis direction thereof.
Figure 18:
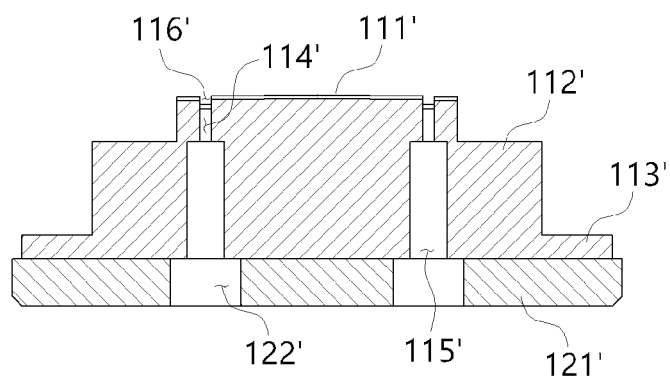
FIG. 18 is a cross-sectional view taken along line B-B of FIG. 10.

FIGS. 11 and 12 are perspective views illustrating the adsorption rubber 110' of the magnetic collet 100' according to the second embodiment of the present invention when viewed from above and below, respectively, FIGS. 13 and 14 are a perspective view illustrating the metal plate 120' of the magnetic collet 100' according to the second embodiment of the present invention when viewed from above, and a bottom view illustrating the magnetic collet 100' according to the second embodiment of the present invention, FIG. 15 is a side view illustrating the magnetic collet 100' according to the second embodiment of the present invention in a long axis direction thereof, and FIG. 16 is a cross-sectional view taken along line A-A of FIG. 10. In addition, FIG. 17 is a side view illustrating the magnetic collet 100' according to the second embodiment of the present invention in a short axis direction thereof, and FIG. 18 is a cross-sectional view taken along line B-B of FIG. 10.

The magnetic collet 100' is a collet configured to pick up the semiconductor chip D and includes the adsorption rubber 110' and the metal plate 120' as illustrated in FIGS. 10 to 20. That is, the magnetic collet 100' may pick up the semiconductor chip D using a vacuum suction force supplied through the holder hole 220'. However, the magnetic collet 100' may include components which are the same as those of the magnetic collet 100 according to the first embodiment.

The adsorption rubber 110' is rubber including a rubber resin material and directly comes into contact with the semiconductor chip D. The adsorption rubber 110' may include a rubber base 113' having a plate shape, a first protrusion 112' protruding toward one surface of the rubber base 113', a second protrusion 111' protruding toward one surface of the first protrusion 112', and a plurality of individual holes 114' and 115'. In this case, one surface of the second protrusion 111' may serve as a contact surface for the semiconductor chip D, and the other surface of the rubber base 113' may serve as a contact surface for the metal plate 120'. For example, the second protrusion 111' and the rubber base 113' may be manufactured through a molding process and the like, formed of the same material, and integrally formed but are not limited thereto. In addition, the adsorption rubber 110' may have a form in which the first protrusion 112' is omitted and the second protrusion 111' protrudes toward one surface of the rubber base 113'.

One surface, which directly comes into contact with the semiconductor chip D, of the second protrusion 111' may be formed in in a round shape. In this case, the round shape may be formed in a curved shape in which a height of one surface of the second protrusion 111' is increased (that is, a thickness is further increased or further protrudes) in a direction toward a central portion of one surface of the second protrusion 111'. That is, the round shape may be the shape in which the height is decreased (that is the thickness is decreased or protrudes less) in a direction from the central portion of one surface of the second protrusion 111' toward a first side and a second side positioned at both sides thereof. In this case, referring to FIG. 14, a left vertical line portion may be disposed in a direction toward the first side, and a right vertical line portion may be disposed in a direction toward the second side.

Since one surface of the second protrusion 111' has the round shape as described above, as illustrated in FIGS. 20, when the semiconductor chip transfer apparatus according to the present invention approaches the semiconductor chip D which is a transfer target, the central portion, which is the furthest protruding portion in the round shape, may come into contact with the semiconductor chip D first, and when the vacuum suction force is applied in such a state, the semiconductor chip D may be attached to one surface of the second protrusion 111' in a state in which the semiconductor chip D is bent according to the round shape, and the semiconductor chip D may be transferred. Accordingly, in the semiconductor chip transfer apparatus according to the present invention, since the central portion always comes into contact with the transfer target semiconductor chip D first, the transfer target semiconductor chip D may be stably attached to the second protrusion 111' without changing a position of the transfer target semiconductor chip D. That is, in the present invention, the semiconductor chip D may be transferred to a substrate S without changing the position of the transfer target semiconductor chip D, and an effect on a position change of an adjacent semiconductor chip may be reduced.

The individual holes 114' and 115' may be formed to pass therethrough from one surface of the second protrusion 111' to the other surface of the rubber base 113'. That is, the individual holes 114' and 115' may include first openings 114' formed in one surface of the second protrusion 111' and second openings 115' formed in the other surface of the rubber base 113', and passages of the first opening 114' may be connected to passages of the second opening 115'.

In the individual holes 114' and 115', an area of the first opening 114' formed in one surface of the second protrusion 111' may be less than an area of the second opening 115' formed in the other surface of the rubber base 113' in order to further increase the vacuum suction force applied from the one surface of the second protrusion 111'. For example, the first opening 114' may have a polygonal shape of which a size is less than a size of the second opening 115', and the second opening 115' may have a circular shape of which the size is greater than the size of the first opening 114', but the first opening 114' and the second opening 115' are not limited thereto.

The metal plate 120' is a plate including a metal material. That is, one surface of the metal plate 120' is in contact with and coupled to the other surface of the rubber base 113' of the adsorption rubber 110', and the other surface of the metal plate 120' may be attached and coupled to the collet holder 200' by a magnetic force of the magnetic part of the collet holder 200' due to properties of the material thereof.

The metal plate 120' includes a common hole 122' formed in a metal base 121' having a plate shape. In this case, the common hole 122' is a hole passing therethrough from one surface of the metal base 121' to the other surface thereof and is connected to (communicates with) the individual holes 114' and 115' of the adsorption rubber 110' to provide a common passage therefor. Accordingly, the vacuum suction force applied through the holder hole 220' of the collet holder 200' may be distributed and applied to the individual holes 114' and 115' through the common hole 122'. As a result, in the present invention, there is an advantage in that a transfer function for the semiconductor chip D may be performed even in a case in which the contact surface 210' is flat because the collet holder 200' does not include an additional common groove in the contact surface 210'.

In addition, the adsorption rubber 110' may also further include a common groove 116'. In this case, the common groove 116' is a groove concavely formed in one surface of the second protrusion 111' in a direction toward the other surface thereof and is connected to (communicates with) the individual holes 114' and 115' to provide a common passage therefor. The common groove 116' may restrict a range of the vacuum suction force applied through the individual holes 114' and 115' and further increase a magnitude of the vacuum suction force. However, a diameter of the passage of the common groove 116' may be less than a diameter of the passage of the common hole 122', which will be described below, to further increase the vacuum suction force applied from one surface of the second protrusion 111'. In this case, an area of a range in which the individual holes 114' and 115' and the common groove 116' are formed may be less than an area of the semiconductor chip D for suction and attachment of the semiconductor chip D. For example, the common groove 116 may be formed in a shape such as a polygonal ring shape including a quadrilateral shape but is not limited thereto.

Particularly, for more effective attachment for the semiconductor chip D, the individual holes 114' and 115' of the adsorption rubber 110' may be disposed in at least two rows in a direction from the first side of one surface of the second protrusion 111' to the second side which is a corresponding side thereof. In this case, in the individual holes 114' and 115, the opening 114' of the second protrusion 111' may be formed in a shape extending in the direction from the first side toward the second side. This is to match directions of common suction forces applied through the individual holes 114' and 115' according to the arrangement directions thereof.

In addition, the common hole 122' of the metal plate 120' may be formed in an "H" shape in which two first holes spaced apart from each other and a second hole connecting the first holes are formed. That is, referring to FIG. 14, in the common hole 122', the first holes may be portions spaced apart from each other as an upper side and a lower side that extend horizontally, and the second hole may be a portion that extends vertically to connect the first holes. In this case, the individual holes 114' and 115' of the adsorption rubber 110' may be disposed in the rows at positions corresponding to the first holes of metal plate 120'. However, unlike FIG. 14, one or more of the individual holes 114' and 115 of the adsorption rubber 110' may be disposed at positions corresponding to the second hole of the metal plate 120'. Particularly, the arrangement of the common hole 122' having the "H" shape and the arrangement of the individual holes 114' and 115' according thereto may allow a common connecting passage therebetween to be restricted within a specific range to further increase the vacuum suction force. Accordingly, a problem of the conventional magnetic collet, which will be described below, may be solved.

That is, since the conventional magnetic collet does not include such a common hole 122', a collet holder 200' should include a common groove, which serves a function of the common hole 122', in a contact surface 210'. That is, since the conventional magnetic collet does not include the common groove in the contact surface 210', there is a problem in that the conventional magnetic collet may not be applied to the collet holder 200' of which the contact surface is flat.

In addition, the metal plate 120' may further include alignment holes 123' passing through one surface and the other surface thereof to allow a coupling position to be aligned. For example, the alignment hole 123' may have a shape similar to a shape of the metal base 131' but is not limited thereto.

Third Embodiment

Figure 21:
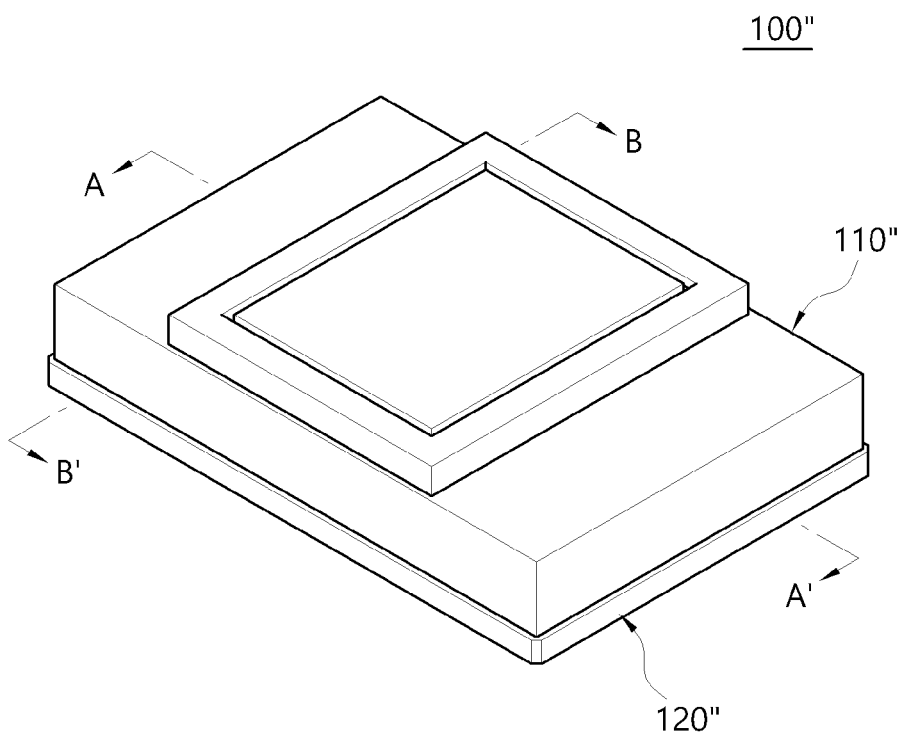
FIG. 21 is a perspective view illustrating a magnetic collet (100") according to a third embodiment of the present invention.
Figure 30:
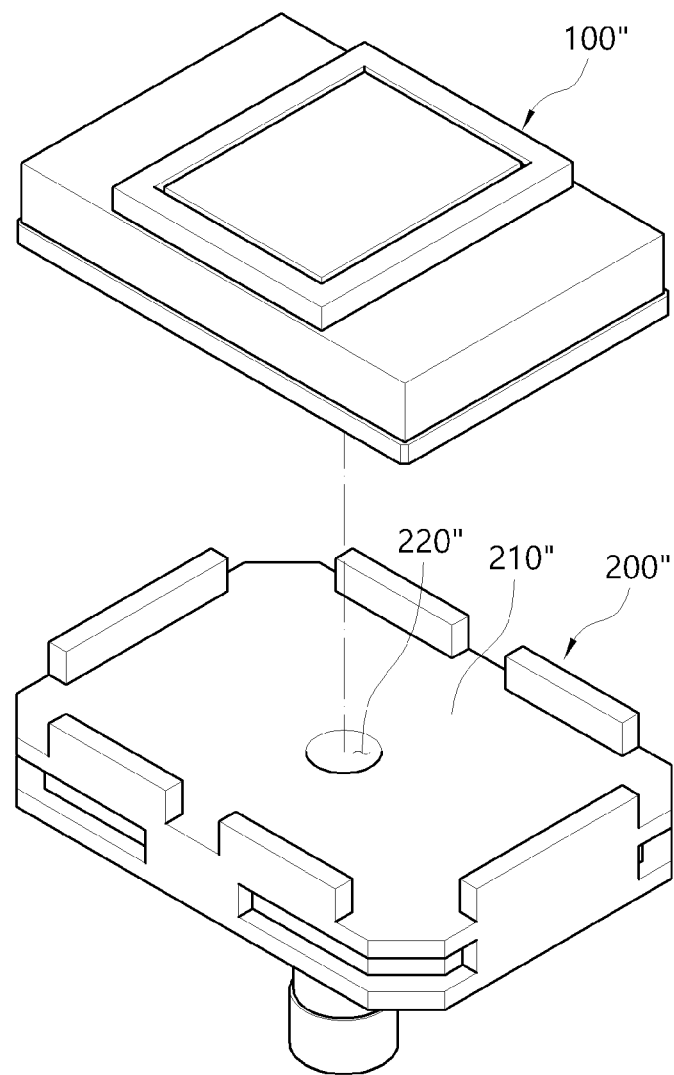
FIG. 30 is a view illustrating a chip transfer apparatus according to the third embodiment of the present invention semiconductor.

FIG. 21 is a perspective view illustrating a magnetic collet 100" according to a third embodiment of the present invention, and FIG. 30 is a view illustrating a chip transfer apparatus according to the third embodiment of the present invention semiconductor.

The semiconductor chip transfer apparatus according to the third embodiment of the present invention is an apparatus configured to pick up and transfer semiconductor chips, which are made by cutting a wafer, and includes a magnetic collet 100" and a collet holder 200" as illustrated in FIGS. 21 and 30. In addition to a semiconductor package assembly process, the semiconductor chip transfer apparatus according to the third embodiment of the present invention may be used in a vision inspection process of inspecting whether the appearance of the semiconductor chip is good, such as whether there is surface damage, scratches, or defects of the semiconductor chip.

The collet holder 200" is a holder referred to as a shank coupled to the magnetic collet 100", and a holder hole 220" is formed in a lower surface (that is, a contact surface) 210" thereof in contact with the magnetic collet 100". In this case, a passage of the holder hole 220" is connected to a vacuum supply tube through which air is suctioned so as to provide a vacuum suction force to the semiconductor chip, and the holder hole 220" is exposed at the contact surface 210" of the collet holder 200".

The collet holder 200" includes a part (hereinafter, referred to as a "magnetic part") having a magnetic force. The magnetic part may be formed of one of various kinds of magnets having various sizes. Accordingly, the magnetic collet 100" including a metal plate 120" may be attached and coupled to the collet holder 200" by an attractive magnetic force generated between the metal plate 120" and the magnetic part of the collet holder 200".

The collet holder 200" may further include a fixing part for more firmly fixing the magnetic collet 100" attached and coupled to the collet holder 200". For example, the fixing part may include elastic members providing elastic forces applied in at least two directions toward a central portion thereof and moving members which are connected to the elastic members and are movable while elastically operating toward the central portion of the contact surface 210" but is not limited thereto. That is, adsorption rubber 110", particularly, a rubber base 112", of the magnetic collet 100", which will be described below, may also be further fixed between the moving members by the elastic forces.

Figure 22:
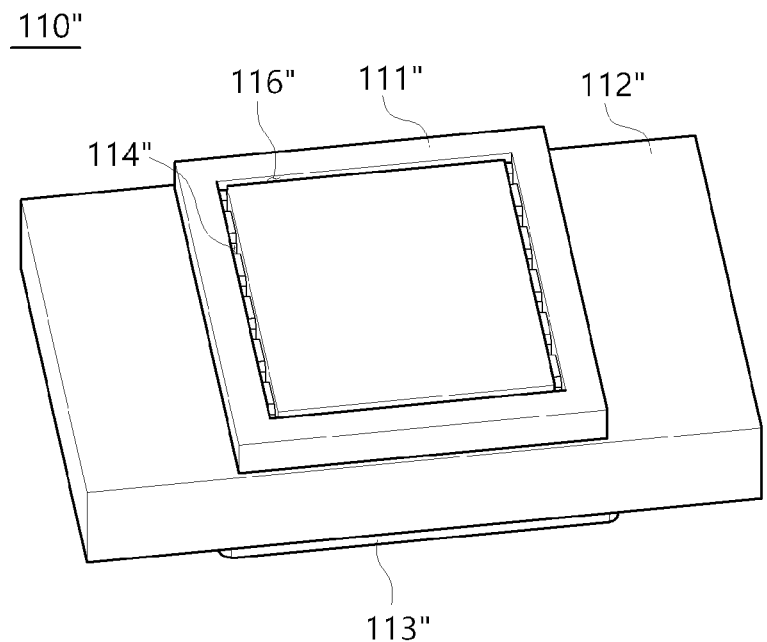
FIG. 22 is a perspective view illustrating adsorption rubber (110") of the magnetic collet (100") according to the third embodiment of the present invention when viewed from above.
Figure 23:
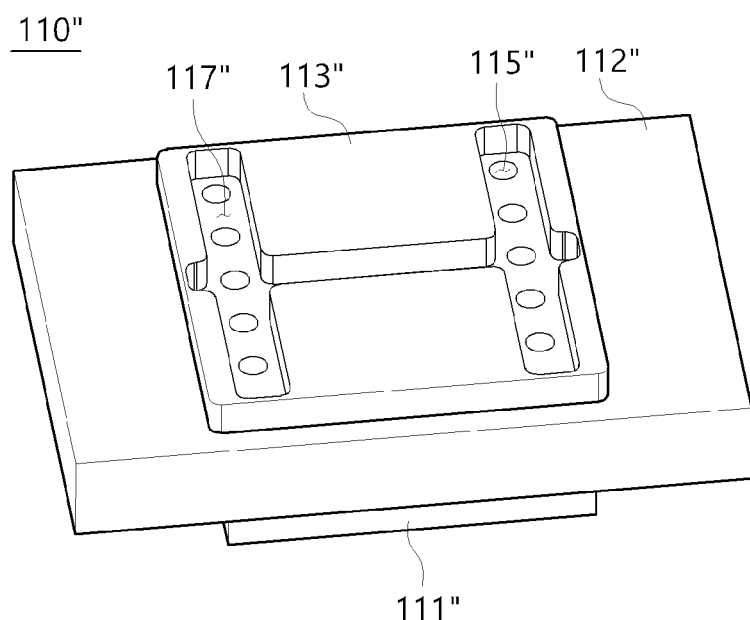
FIG. 23 is a perspective view illustrating the adsorption rubber (110") of the magnetic collet (100") according to the third embodiment of the present invention when viewed from below.
Figure 24:
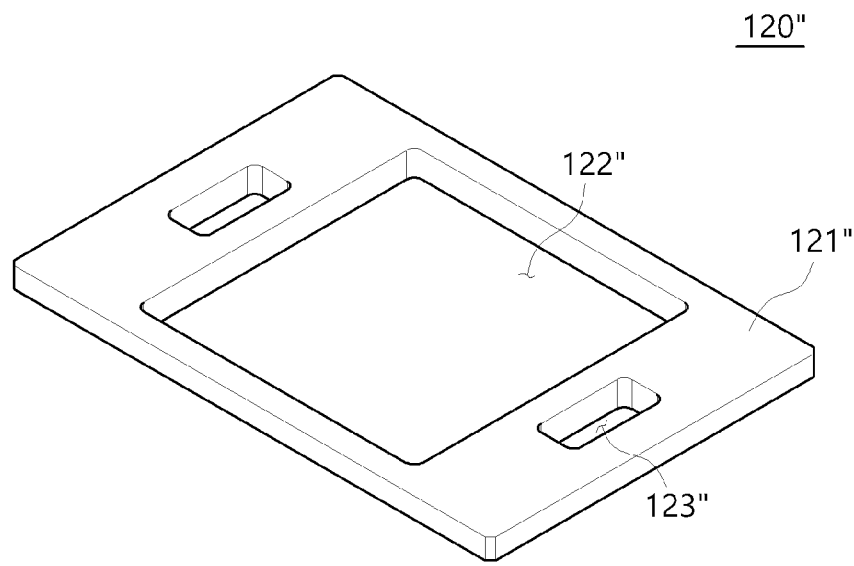
FIG. 24 is a perspective view illustrating a metal plate (120") of the magnetic collet (100") according to the third embodiment of the present invention when viewed from above.
Figure 25:
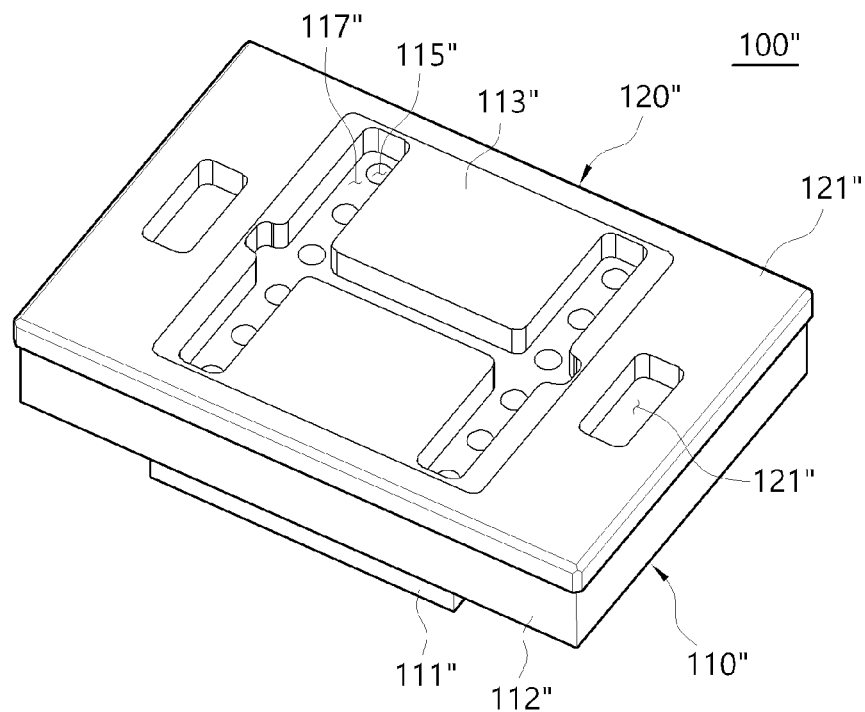
FIG. 25 is a perspective view illustrating the magnetic collet (100") according to the third embodiment of the present invention when viewed from below.
Figure 26:
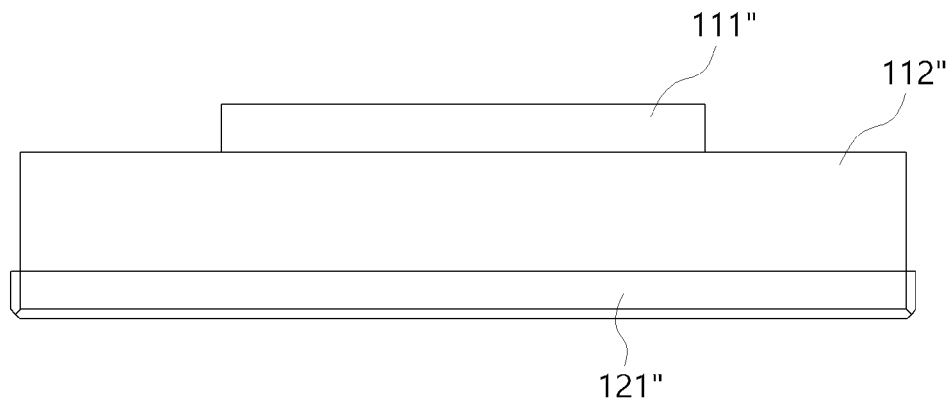
FIG. 26 is a side view illustrating the magnetic collet (100") according to the third embodiment of the present invention in a long axis direction thereof.
Figure 27:
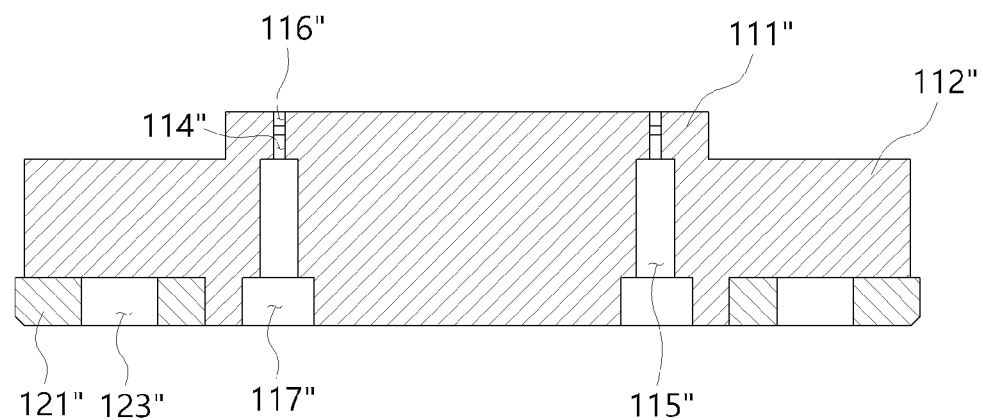
FIG. 27 is a cross-sectional view taken along line A-A of FIG. 21.
Figure 28:
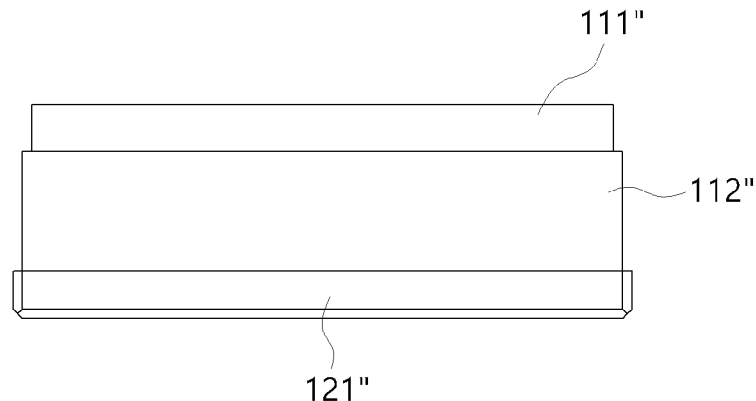
FIG. 28 is a side view illustrating the magnetic collet (100") according to the third embodiment of the present invention in a short axis direction thereof.
Figure 29:
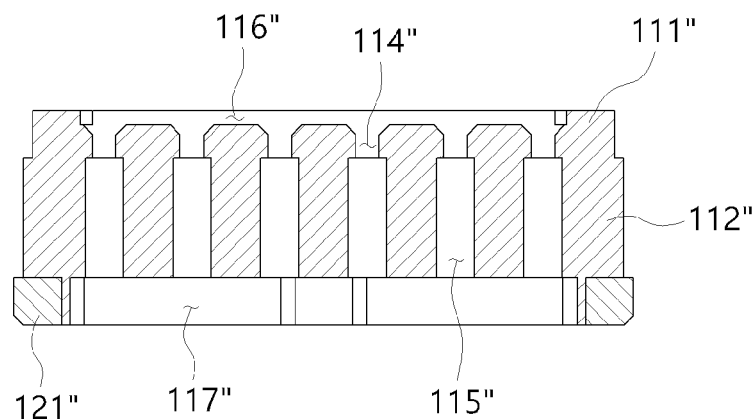
FIG. 29 is a cross-sectional view taken along line B-B of FIG. 21.

FIGS. 22 and 23 are perspective views illustrating the adsorption rubber 110" of the magnetic collet 100" according to the third embodiment of the present invention when viewed from above and below, respectively, FIG. 24 is a perspective view illustrating the metal plate 120" of the magnetic collet 100" according to the third embodiment of the present invention when viewed from above, FIG. 25 is a perspective view illustrating the magnetic collet 100" according to the third embodiment of the present invention when viewed from below, FIG. 26 is a side view illustrating the magnetic collet 100" according to the third embodiment of the present invention in a long axis direction thereof, FIG. 27 is a cross-sectional view taken along line A-A of FIG. 21, FIG. 28 is a side view illustrating the magnetic collet 100" according to the third embodiment of the present invention in a short axis direction thereof, and FIG. 29 is a cross-sectional view taken along line B-B of FIG. 21.

The magnetic collet 100" is a collet configured to pick up the semiconductor chip and includes the adsorption rubber 110" and the metal plate 120" as illustrated in FIGS. 21 to 30. That is, the magnetic collet 100" may pick up the semiconductor chip using a vacuum suction force supplied through the holder hole 220". However, the magnetic collet 100" may include components which are the same as those of the magnetic collet 100 according to the first embodiment or those of the magnetic collet 100' according to the second embodiment.

The adsorption rubber 110" is rubber including a rubber resin material and directly comes into contact with the semiconductor chip. The adsorption rubber 110" may include the rubber base 112" having a plate shape, a first protrusion 111" protruding toward one surface of the rubber base 112", a second protrusion 113" protruding toward the other surface of the rubber base 112", and a plurality of individual holes 114" and 115". In this case, one surface of the first protrusion 111" may serve as a contact surface for the semiconductor chip, the other surface of the rubber base 112" may serve as a contact surface for the metal plate 120", and the second protrusion 113" may serve as an insertion portion for the metal plate 120". For example, the first protrusion 111", the rubber base 112", and the second protrusion 113" may be manufactured through a molding process and the like, formed of the same material, and integrally formed but are not limited thereto.

The individual holes 114" and 115" may be formed to pass therethrough from one surface of the first protrusion 111" to the other surface of the second protrusion 113". That is, the individual holes 114" and 115" may include first openings 114" formed in one surface of the first protrusion 111" and second openings 115" formed in the other surface of the second protrusion 113", and passages of the first openings 114" may be connected to passages of the second openings 115".

Particularly, in the individual holes 114" and 115", an area of the first opening 114" formed in one surface of the first protrusion 111" may be less than an area of the second opening 115" formed in the other surface of the second protrusion 113" in order to further increase the vacuum suction force applied from one surface of the first protrusion 111". For example, the first opening 114" may have a polygonal shape of which a size is less than a size of the second opening 115", and the second opening 115" may have a circular shape of which the size is greater than the size of the first opening 114", but the first opening 114" and the second opening 115" are not limited thereto.

In addition, for more effective attachment for the semiconductor chip, the individual holes 114" and 115" of the adsorption rubber 110" may be disposed in at least twenty-one rows in a direction from a first side of one surface of the first protrusion 111" to a second side which is a corresponding side thereof. That is, referring to FIG. 22, one side of the adsorption rubber 110" in a short axis direction thereof may be disposed in a direction toward the first side, and the other side of the adsorption rubber 110" in the short axis direction may be disposed in a direction toward the second side. In this case, in the individual holes 114" and 115", the opening 114" of the first protrusion 111" may be formed in a shape extending in the direction from the first side toward the second side. This is to match directions of common suction forces applied through the individual holes 114" and 115" according to the arrangement directions thereof.

In addition, the adsorption rubber 110" may include a first common groove 117" and a second common groove 116".

The common groove 117" is a groove concavely formed in the other surface of the second protrusion 113" in a direction toward one surface thereof and is connected to (communicates with) the individual holes 114" and 115" to provide a common passage therefor. Accordingly, a vacuum suction force applied through the holder hole 220" of the collet holder 200" may be distributed and applied to the individual holes 114" and 115" due to the first common groove 117". As a result, the present invention has an advantage in that a transfer function for the semiconductor chip may be performed even in a case in which the contact surface 210" is flat because the collet holder 200" does not include an additional common groove in the contact surface 210". In this case, a height of an upper surface in the first common groove 117" may be equal to a height of the other surface of the rubber base 112" but is not limited thereto and may also be greater than or less than the height of the rubber base 112".

The first common groove 117" may restrict a range of the vacuum suction force applied through the individual holes 114" and 115" and further increase a magnitude of the vacuum suction force. However, a diameter of the passage of the second common groove 116" may be less than a diameter of the passage of the first common groove 117" to further increase the vacuum suction force applied from one surface of the first protrusion 111". Particularly, the first common groove 117" may have a H shape in which two first grooves spaced apart from each other and a second groove connecting the first grooves are formed. In this case, the individual holes 114" and 115" of the adsorption rubber 110" may be disposed in the rows at positions corresponding to the first grooves. However, unlike FIG. 23, one or more of the individual holes 114" and 115" of the adsorption rubber 110" may be disposed at positions corresponding to the second groove. Particularly, the arrangement of the first common groove 117" having the "H" shape and the arrangement of the individual holes 114" and 115" according thereto may allow a common connecting passage therebetween to be restricted within a specific range to further increase the vacuum suction force.

The second common groove 116" is a groove concavely formed in one surface of the first protrusion 111" in a direction toward the other surface thereof and is connected to (communicates with) the individual holes 114" and 115" to provide a common passage therefor. The first common groove 117" may restrict a range of the vacuum suction force applied through the individual holes 114" and 115" and further increase a magnitude of the vacuum suction force. In this case, an area of a range in which the individual holes 114" and 115", the first common groove 117", and the second common groove 116" are formed may be less than an area of the semiconductor chip for suction and attachment of the semiconductor chip. For example, the second common groove 116" may be formed in a shape such as a polygonal ring shape including a quadrilateral shape but is not limited thereto.

The metal plate 120" is a plate including a metal material. That is, one surface of the metal plate 120" is in contact with and is coupled to the other surface of the rubber base 112" of the adsorption rubber 110", and the other surface of the metal plate 120" may be attached and coupled to the collet holder 200" by a magnetic force of the magnetic part of the collet holder 200" due to properties of the material thereof.

The metal plate 120" includes an insertion hole 122" formed in a metal base 121" having a plate shape. In this case, the insertion hole 122" is a hole passing therethrough from one surface to the other surface of the metal base 121" and may be formed in a shape corresponding to the second protrusion 113" of the adsorption rubber 110". That is, the second protrusion 113" of the adsorption rubber 110" may be inserted into the insertion hole 122" so that the rubber 110" may be coupled to the metal plate 120". Accordingly, in the present invention, the adsorption rubber 110" and the metal plate 120" have replaceable structures. However, the adsorption rubber 110" may also be attached to the metal plate 120" by an adhesive when coupled.

In addition, the metal plate 120" may further include alignment holes 123" passing through one surface and the other surface thereof to allow a coupling position to be aligned. For example, the alignment hole 123" may have a shape similar to a shape of the metal base 131" but is not limited thereto.

In the present invention having the above-described structure, since a vacuum suction force can be distributed and applied to individual holes from a holder hole of a collet holder by a common hole, there is an advantage in that a transfer function for a semiconductor chip can be performed even in a case in which a contact surface is flat because the collet holder does not include an additional common groove in the contact surface. In addition, in the present invention, since a contact surface of adsorption rubber configured to come into contact with the semiconductor chip D is formed in a round shape having a protruding central portion, the central portion always comes into contact with the transfer target semiconductor chip D first, and thus there are advantages in that the transfer target semiconductor chip D can be more stably adsorbed and transferred without changing a position thereof, and an effect on a position change of an adjacent semiconductor chip can also be reduced. In addition, since the present invention has a structure in which the adsorption rubber and a metal plate are replaceable, there is an advantage in that, in a case in which a magnetic collet needs to be replaced to correspond to one of sizes of various semiconductor chips, only the adsorption rubber is replaced without changing an entirety of the magnetic collet in which the adsorption rubber and the metal plate are coupled.

Although the specific embodiments have been described in the detail description of the present invention, various modifications may be made without departing from the scope of the present invention. Therefore, the scope of the present invention is defined not by the described embodiment but by the appended claims and encompasses equivalents that fall within the scope of the appended claims.

What is claimed is:

1. A magnetic collet comprising:
   adsorption rubber including a plurality of individual holes passing therethrough from a contact surface, which is one surface of the adsorption rubber, coming into contact with a semiconductor chip to the other surface thereof; and
   a metal plate including a common hole, which passes therethrough from one surface of the metal plate to the other surface thereof and provides a common passage connected to the individual holes, and stacked on the adsorption rubber,
   wherein the contact surface, which comes into contact with the semiconductor chip, of the adsorption rubber is formed in a round shape.

2. The magnetic collet of claim 1, wherein a thickness of the round shape increases in a direction toward a central portion of the contact surface.

3. The magnetic collet of claim 1, wherein a thickness of the round shape decreases in a direction from a central portion of the contact surface toward a first side and a second side positioned at both sides of the contact surface.

* * * * *